United States Patent
Shen et al.

(10) Patent No.: US 8,809,088 B2
(45) Date of Patent: Aug. 19, 2014

(54) STRUCTURE OF STACKING CHIPS AND METHOD FOR MANUFACTURING THE SAME

(71) Applicant: Chipmos Technologies Inc., Hsinchu (TW)

(72) Inventors: Geng-Shin Shen, Hsinchu (TW); Ya Chi Chen, Hsinchu (TW); I-Hsin Mao, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 13/801,255

(22) Filed: Mar. 13, 2013

(65) Prior Publication Data

US 2013/0249042 A1 Sep. 26, 2013

(30) Foreign Application Priority Data

Mar. 20, 2012 (TW) .............................. 101109411 A

(51) Int. Cl.
*H01L 21/00* (2006.01)
*H01L 27/146* (2006.01)
*H01L 23/00* (2006.01)

(52) U.S. Cl.
CPC .... *H01L 27/14636* (2013.01); *H01L 27/14683* (2013.01); *H01L 23/00* (2013.01); *H01L 27/14687* (2013.01)
USPC ............................................. 438/29; 438/27

(58) Field of Classification Search
USPC .............. 438/26, 29, 42, 107, 108, 109, 110, 438/111, 118, 27
See application file for complete search history.

(56) References Cited

U.S. PATENT DOCUMENTS

| | | | | |
|---|---|---|---|---|
| 6,674,159 | B1 * | 1/2004 | Peterson et al. | 257/680 |
| 7,321,455 | B2 * | 1/2008 | Kinsman | 359/245 |
| 7,619,315 | B2 * | 11/2009 | Kwon et al. | 257/777 |
| 8,330,268 | B2 * | 12/2012 | Suto | 257/704 |
| 2010/0032830 | A1 | 2/2010 | Chang et al. | |
| 2012/0313207 | A1 * | 12/2012 | Oganesian | 257/433 |
| 2014/0035892 | A1 * | 2/2014 | Shenoy et al. | 345/205 |

FOREIGN PATENT DOCUMENTS

TW 201007914 A 2/2010

OTHER PUBLICATIONS

Taiwan Office Action for Taiwan Application No. 101109411 dated Jan. 21, 2014 with English Abstract.

* cited by examiner

*Primary Examiner* — S. V. Clark
(74) *Attorney, Agent, or Firm* — Muncy, Geissler, Olds & Lowe, P.C.

(57) ABSTRACT

A structure of stacking chips and a method for manufacturing the structure of stacking chips are provided. A wafer with optical chips and a glass substrate with signal processing chips are stacked with each other, and then subjected to ball mounting and die sawing to form the stacked packaging structure. The optical chips and the signal processing chips form the electrical connection on the surface of the glass substrate via the through holes thereof.

5 Claims, 11 Drawing Sheets

STRUCTURE OF STACKING CHIPS AND METHOD FOR MANUFACTURING THE SAME

CROSS-REFERENCES TO RELATED APPLICATIONS

This application claims priority to Taiwan Patent Application No. 101109411 filed on Mar. 20, 2012, which is hereby incorporated herein by reference in its entirety

BACKGROUND OF THE INVENTION

1. Field of the Invention

The present invention provides a structure of stacking chips and a method for manufacturing the same, with the structure of stacking chips comprising signal processing chips and optical chips.

2. Descriptions of the Related Art

With the evolution of people's living habits and the advancement of manufacturing technologies, imaging sensors have been generally used in the daily life. The imaging sensors that have already been known are, for example, complementary metal-oxide semiconductor (CMOS) imaging sensors and charge coupled device (CCD) imaging sensors. The CMOS imaging sensors have advantages, such as a lower price and power consumption, and are usually suitable for use in low-level products. The CCD imaging sensors can capture images of a better quality, which is the reason why they have been the primary products in the market of high-level imaging sensors.

However, combining digital signal processor (DSP) chips with the CMOS imaging sensors can compensate for the shortcomings of the CMOS imaging sensors. In detail, the DSP chips can simulate human eyes to process what photosensitive components cannot identified, and further contribute to the imaging performance of the CMOS imaging sensors by using an algorithm. Therefore, the modules combining the CMOS imaging sensors and the DSP chips have been gradually used in high-resolution portable products such as digital video cameras and digital cameras.

With reference to FIGS. 1A to 1C, a conventional package structure 1 for CMOS imaging sensor (CIS) chips 11 and DSP chips 12, and its manufacturing process of the package structure 1 are shown therein. As shown in FIG. 1A, multiple imaging sensor chips 11 are formed on a wafer 13 and then sliced into individual imaging sensor chips 11, and each imaging sensor chip 11 has multiple first contacts 111 distributed at two sides of the imaging sensor chip 11. Likewise, as shown in FIG. 1B, multiple DSP chips 12 are also formed on a wafer 14 and then sliced into individual DSP chips 12, and each DSP chips 12 has multiple second contacts 121 distributed at the two sides of the DSP chip 12.

With reference to FIG. 1C, in the prior art, the individual sliced imaging sensor chips 11 and the individual DSP chips 12 transversely aligned and arranged on a substrate, and then the first contacts 111 and the second contacts 121 are sequentially electrical connected through wire bonding.

Conceivably in the prior art, first the wafer 13 and the wafer 14 are sliced respectively to form the individual imaging sensor chips 11 and the individual DSP chips 12 which are corresponding sizes. Then the imaging sensor chips 11 and the DSP chips 12 are attached respectively and the imaging sensor chips 11 and the DSP chips 12 are connected through wire bonding. The prior art requires a complex manufacturing process and a long production cycle, which increases manufacturing costs. In addition, the imaging sensor chips 11 and the DSP chips 12 are transversely arranged on the substrate side by side and, thus, it's occupied a relatively larger area, and the reliability of wire bonding is poor. Consequently, the prior art tends to cause poor contact or poor stability.

In view of this, an urgent need exists in the art to provide a structure of stacking chips and a method for manufacturing the same which can improve the manufacturing process, reduce the volume and occupied area and increase the reliability.

SUMMARY OF THE INVENTION

An objective of the present invention is to reduce the arrangement space of the chip stacking structure. With the package structure of stacking chips, the package structure of the prior art in which the chips were arranged in parallel and occupying a relatively large area can be avoided. Apart from reducing the occupied area, the structure of stacking chips of the present invention can further free the space for use by other components.

Another objective of the present invention is to simplify the manufacturing process of the structure of stacking chips Instead of firstly forming individual imaging sensor chips and individual DSP chips through slicing, a single structure of stacking chips is produced by firstly connecting a wafer comprising multiple imaging sensor chips and a substrate comprising multiple DSP chips in alignment and then slicing the assembly formed by the wafer and the substrate, so some of the conventional needs are eliminated such as the subsequent positioning and wire bonding. This can significantly simplify the manufacturing process and reduce the production cost.

A further objective of the present invention is to improve the reliability and the stability of the structure of stacking chips and the manufacturing process thereof. By stacking the imaging sensor chips and the DSP chips together in alignment and electrically connecting the imaging sensor chips and the DSP chips to an outer surface of the substrate via multiple through holes in the substrate which are plated with metal on the inner surfaces thereof, the stability and the reliability of the overall structure are improved significantly.

To achieve the aforesaid objectives, the present invention provides a structure of stacking chips, which comprises a signal processing chip module and an optical chip module. The signal processing chip module comprises the following: a glass substrate, with a first surface and a second surface opposite to the first surface, in which the first surface is provided with a cavity formed thereon, wherein the glass substrate is provided with a plurality of through holes formed between the first and second surfaces, and some of the through holes are formed at an area where the cavity is formed; and wherein each of the through holes is defined by an inner surface plated with a metal to electrically connect the first surface and the second surface; and a signal processing chip, being disposed in the cavity. The optical chip module comprises an optical chip. The optical chip module is disposed on the first surface of the glass substrate and overlapping the signal processing chip module, wherein the optical chip has a surface area greater than the surface area of the signal processing chip to fully cover the signal processing chip. The signal processing chip and the optical chip comprise respectively multiple electrical contacts correspondingly connected with the through holes.

The present invention further provides a method of manufacturing a structure of stacking chips, which comprises the following steps: First, forming a plurality of cavities on a first surface of a glass substrate according to a predetermined layout. Then, forming a plurality of through holes on the glass substrate and plating a metal on an inner surface of each of the through holes. Disposing a plurality of multiple signal processing chips respectively in the cavities and each of the signal processing chips is electrically connected with the inner surface of each of the through holes; forming a plurality of optical chips on a wafer; and stacking the wafer and the glass substrate so that the optical chips and the signal processing chips are electrically connected via the respective through holes.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
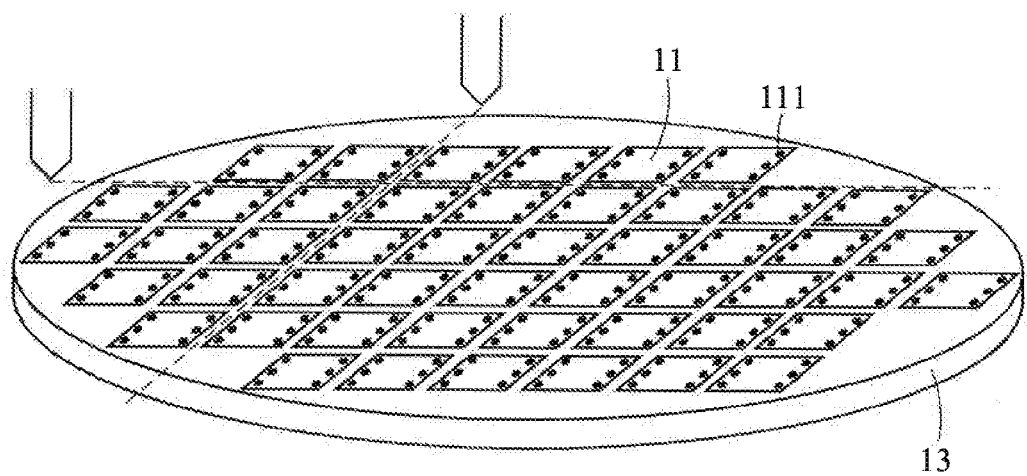
FIG. 1A is a schematic view illustrating the manufacturing of imaging sensor chips in the prior art.
Figure 1B:
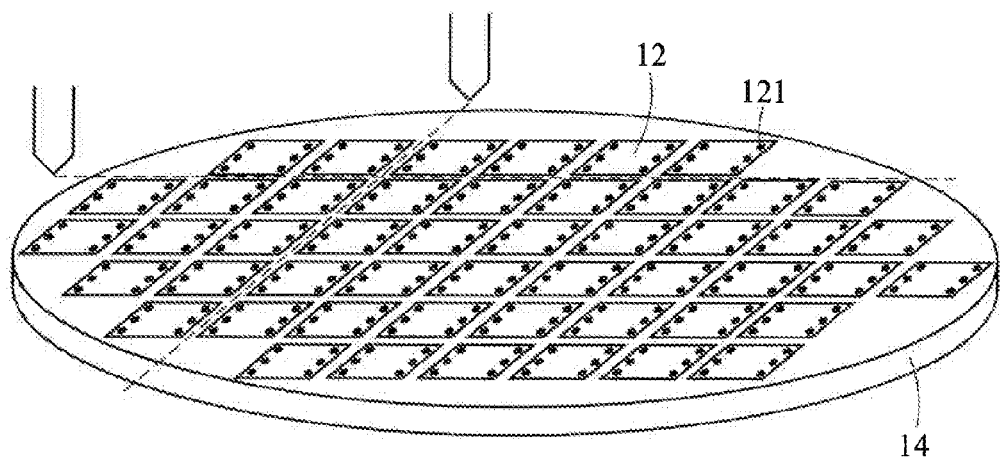
FIG. 1B is a schematic view illustrating the manufacturing of DSP chips in the prior art.
Figure 1C:
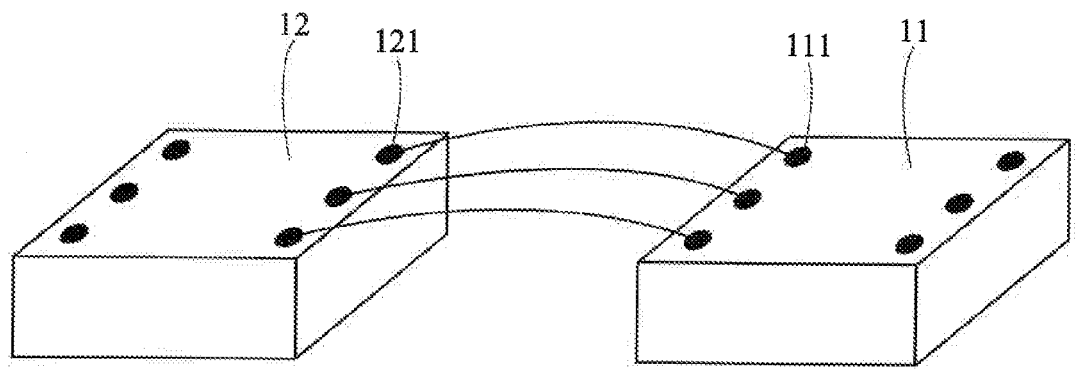
FIG. 1C is a schematic view illustrating the chip package structure of the prior art.
Figure 2:
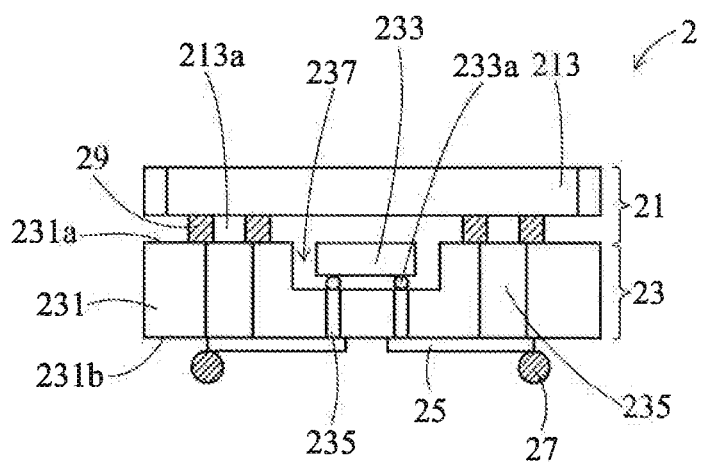
FIG. 2 is a schematic view illustrating structure of stacking chips of the present invention.

FIG. 2 illustrates a schematic cross-sectional view of a structure of stacking chips 2 according to the first embodiment of the present invention. The structure of stacking chips 2 comprises an optical chip module 21 and a signal processing chip module 23 stacked together.

The signal processing chip module 23 comprises a glass substrate 231 and a signal processing chip 233 which is preferably a digital signal processor (DSP) chip. For convenience of description, it is further defined that the glass substrate 231 has a first surface 231a and a second surface 231b opposite to the first surface 231a and is further formed with multiple through holes 235 which have inner surfaces plated with metal to connect the first surface 231a and the second surface 231b.

The first surface 231a of the glass substrate 231 further has a cavity 237 formed thereon in which the signal processing chip 233 is disposed. Through holes 235 plated with metal are also formed in the cavity 237. The signal processing chip 233 further comprises multiple electrical contacts 233a (e.g., conventional bumps) which are correspondingly electrically connected to the corresponding through holes 235.

The structure of stacking chips 2 preferably comprises a conductive wire layer 25 and multiple solder balls 27. The conductive wire layer 25 is formed on the second surface 231b of the glass substrate 231 to be electrically connected with the through holes 235. The solder balls 27 are formed at appropriate positions on the conductive wire layer 25.

The optical chip module 21 comprises an optical chip 213, which is preferably a CMOS imaging sensor (CIS) chip. The optical chip module 21 is stacked with the signal processing chip module 23 on the first surface 231a of the signal processing chip module 23. The surface area of the optical chip 213 is larger than the surface area of the signal processing chip 233 to cover the signal processing chip 233 so that the electrical contacts 233a of the optical chip 213 can be accurately correspondingly connected with some of the through holes 235 outside the signal processing chip 233. Likewise, the optical chip 213 may also comprise multiple electrical contacts 213a (e.g., conventional bumps) which are correspondingly connected to some of the through holes 235.

To securely bond the signal processing chip module 23 and the optical chip module 21 together, the structure of stacking chips 2 of the present invention preferably further comprise a bonding layer 29 applied between the signal processing chip module 23 and the optical chip module 21.

Thus, through the through holes 235 and the conductive wire layer 25, the optical chip 213 and the signal processing chip 233 can be electrically connected on the second surface 231b of the glass substrate 231.

Next, the second embodiment of the present invention, which is a method for manufacturing the structure of stacking chips 2, will be described. Herein below, the method will be described with reference to schematic views of FIGS. 3 to 8 and a flowchart diagram of FIG. 9.

Figure 3:
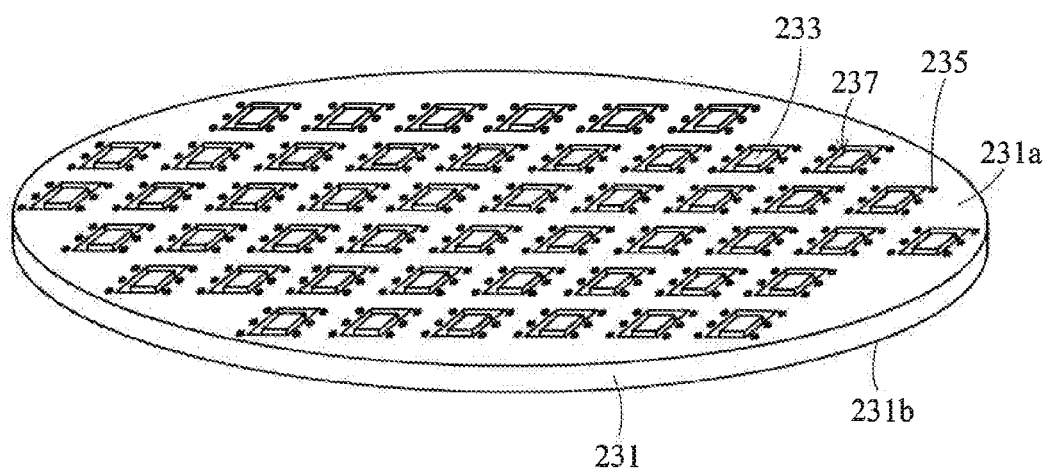
FIG. 3 to FIG. 8 are schematic views illustrating the manufacturing of a structure of stacking chips in the present invention.
Figure 9:
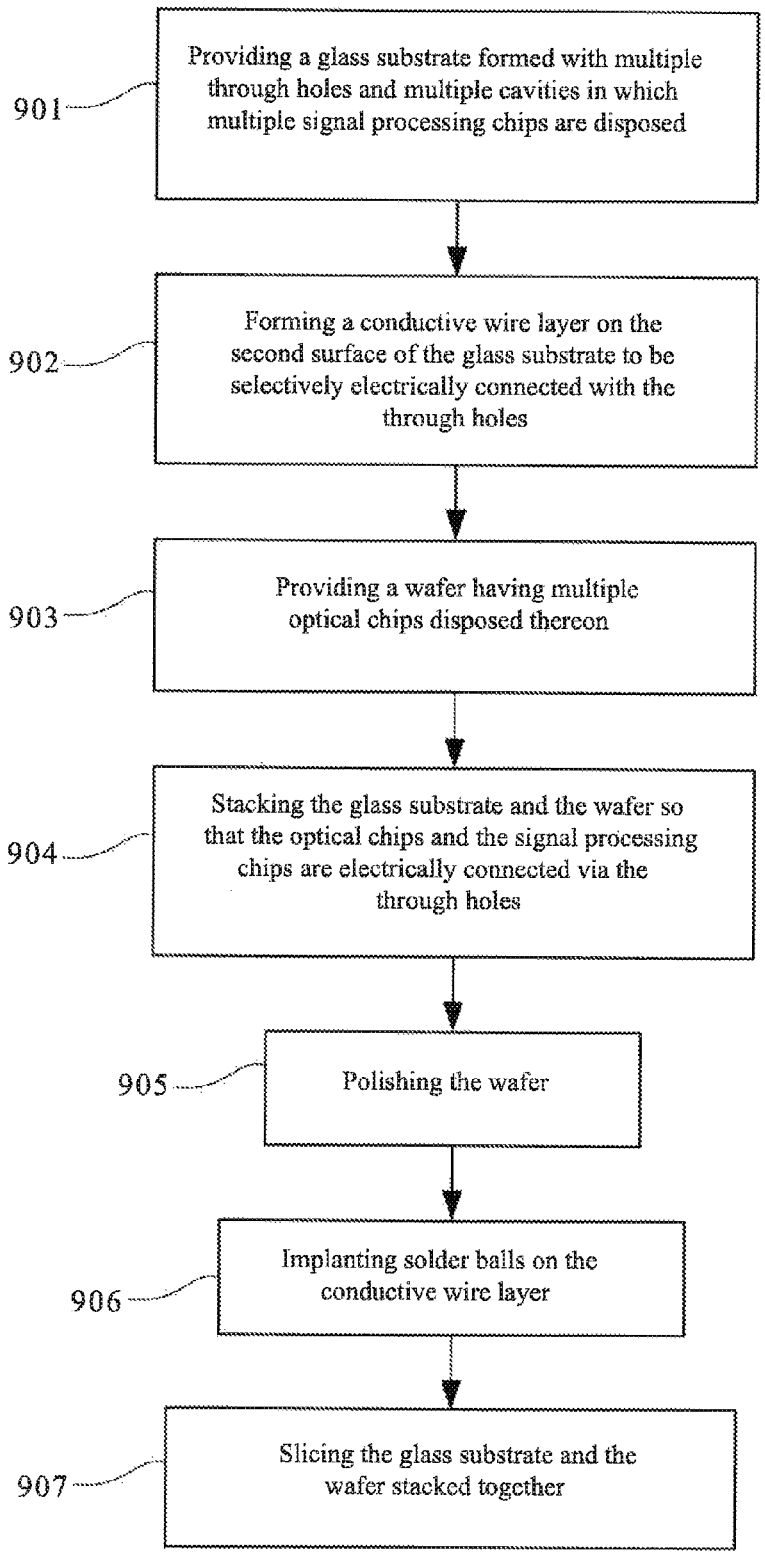
FIG. 9 is a flowchart diagram of a method for manufacturing the structure of stacking chips of the present invention.

First, as shown in FIG. 3 and by step 901 in FIG. 9, a glass substrate 231 is provided, with the glass substrate 231 being formed with multiple through holes 235 and multiple cavities 237 in which multiple signal processing chips 233 are disposed. The glass substrate 231 has a first surface 231a and a second surface 231b opposite to the first surface 231a. The cavities 237 are formed on the first surface 231a according to a layout. The through holes 235 on the cavities 237 and the first surface 231a are plated with metal on the inner surfaces thereof to form contacts on the first surface 231a and the second surface 231b. The signal processing chips 233 are respectively embedded in the cavities 237 and electrically connected with the corresponding through holes 235.

Then, step 902 is executed to form a conductive wire layer 25 on the second surface 231b of the glass substrate 231 to be selectively electrically connected with the through holes 235.

Figure 4:
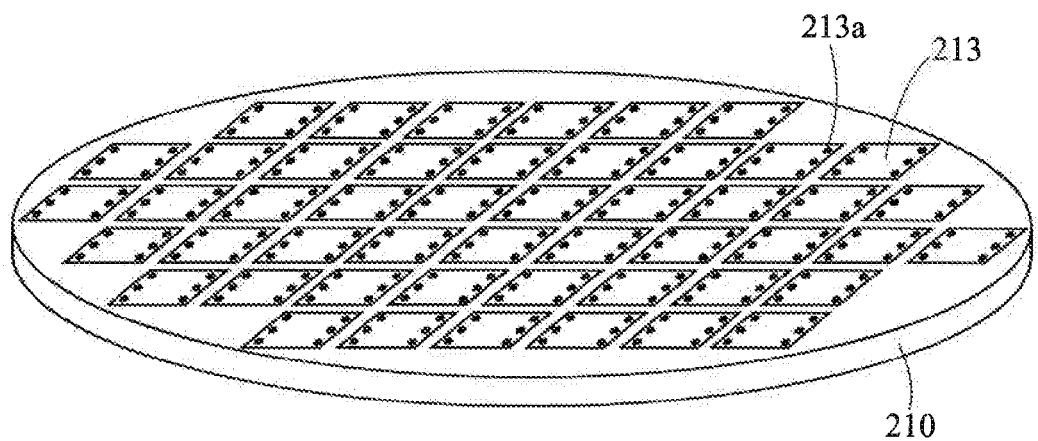

Next, as shown in FIG. 4 and by step 903 in FIG. 9, a wafer 210 (which usually comprises a silicon substrate) is provided, with multiple optical chips 213 formed on the wafer 210. As described in the first embodiment, each of the optical chips 213 further comprises and exhibits multiple electrical contacts 213a, which may be conventional bumps such as gold bumps, solder balls, copper pillar, silver bumps, composite metal bumps or stud bumps.

Figure 5:
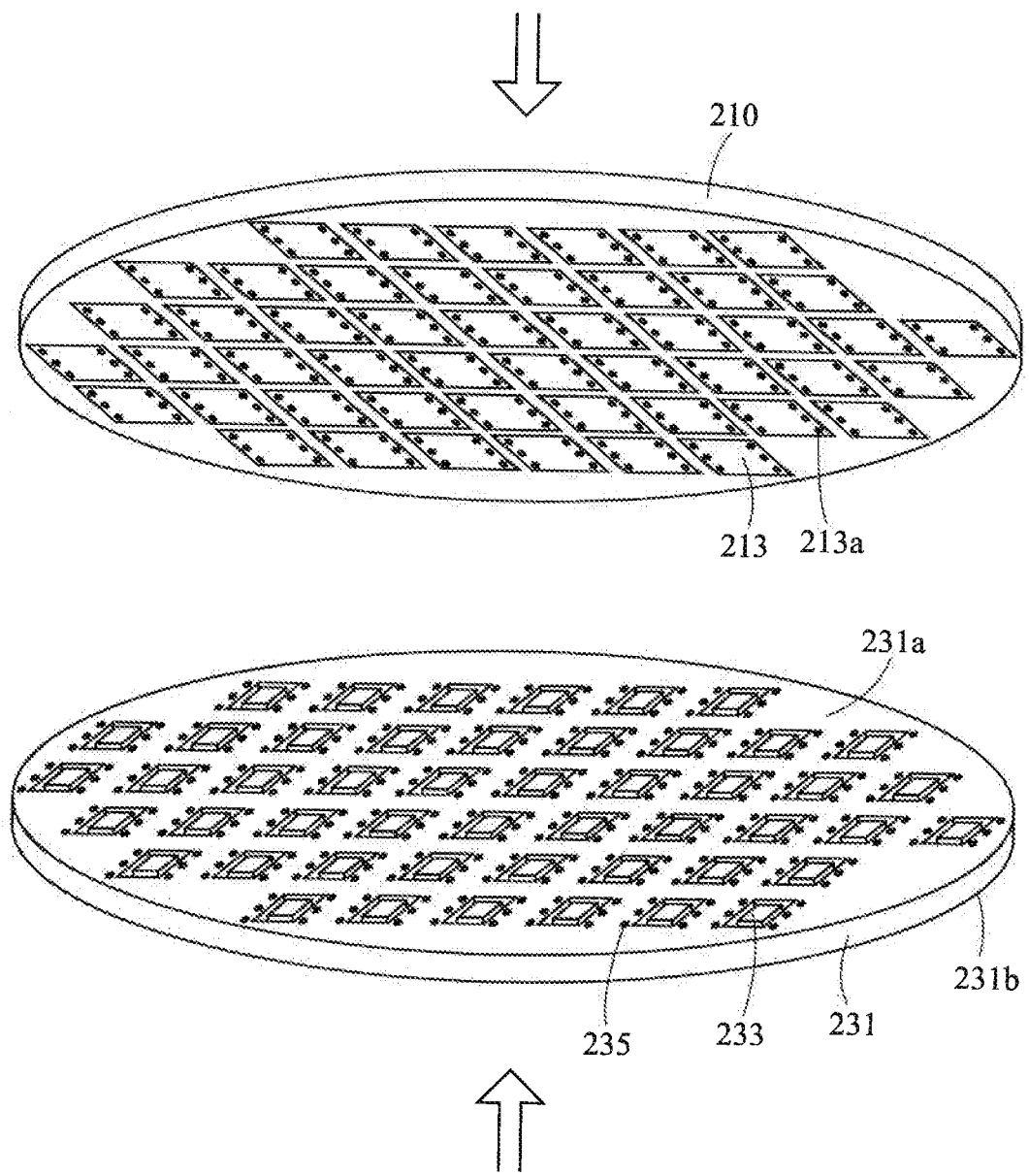

Then, as shown in FIG. 5 and by step 904 in FIG. 9, the glass substrate 231 and the wafer 210 are stacked so that the optical chips 213 and the corresponding signal processing chips 233 are electrically connected via the through holes 235. More specifically, in this step, the wafer 210 is attached onto the first surface 231a of the glass substrate 231 so that the electrical contacts 213a of the optical chips 213 are connected to the corresponding through holes 235.

Figure 6:
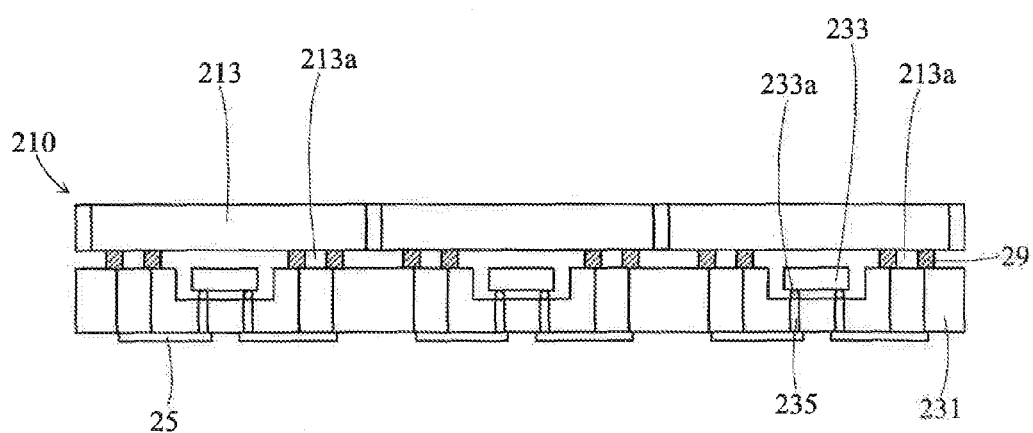

The structure obtained through stacking is as shown in the cross-sectional view of FIG. 6. Each of the optical chips 213 comprises multiple electrical contacts 213a, and each of the signal processing chips 233 comprises multiple electrical contacts 233a. In stacking the glass substrate 231 and the wafer 210, the electrical contacts 213a, 233a are aligned with and electrically connected to the corresponding through holes 235.

In the stacking process of step 904, a bonding layer (or an adhesive layer) 29 is further applied between the glass substrate 231 and the wafer 210 to facilitate bonding therebetween. The bonding layer 29 may be an under-fill adhesive. In another preferred embodiment of the present invention, the bonding layer 29 may be a semi-cured B-stage adhesive that is disposed around the bumps of the chips in advance, and the bonding layer 29 is cured during the stacking of the glass substrate 231 and the wafer 210 to enhance the bonding performance between the optical chips 213 and the signal processing chips 233.

Figure 7:
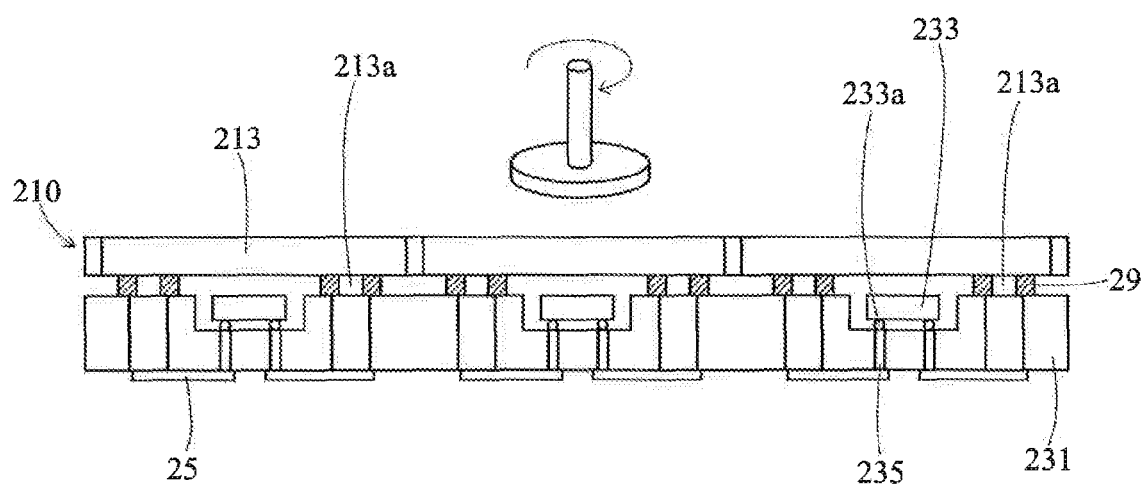

Next, as shown in FIG. 7 and by step 905 in FIG. 9, the back surface of the wafer 210 is polished to reduce the overall thickness of the wafer 210.

Figure 8:
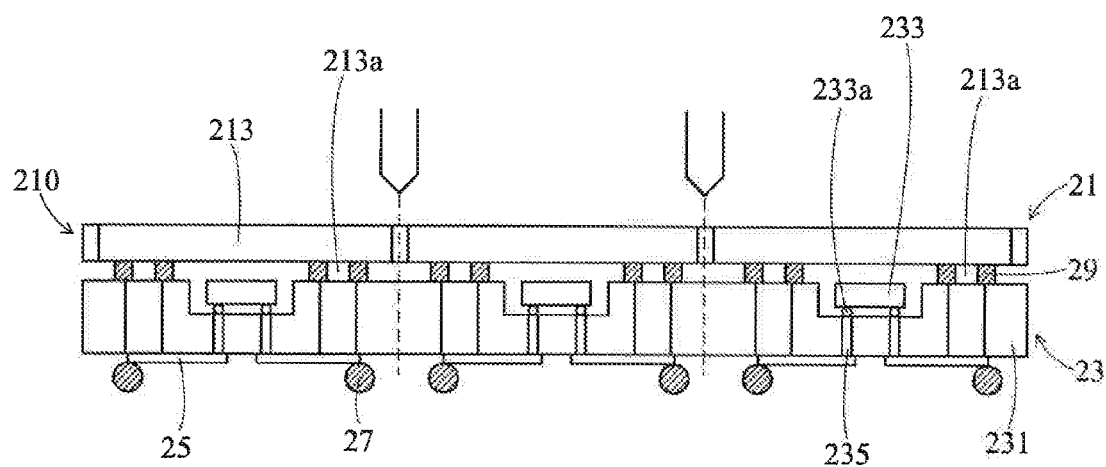

Finally, as shown in FIG. 8, step 906 is executed first to implant multiple solder balls 27 on the conductive wire layer 25 and then step 907 is executed to slice the glass substrate 231 and the wafer stacked together to finally form the structure of stacking chips 2 of the first embodiment. Undoubtedly, the structure of stacking chips 2 comprises the optical chips 213 (e.g., GIS chips) and the signal processing chips 233 (e.g., DSP chips).

According to the above descriptions, in the structure of stacking chips and the method for manufacturing the same disclosed in the present invention, a package structure in which chips are stacked is formed by directly stacking a wafer and a substrate and then slicing them. This can not only reduce the arrangement space and the occupied area of the structure of stacking chips, but also significantly simplify the manufacturing process and reduce the cost. This can further improve the reliability and the stability of the structure of stacking chips.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of manufacturing a structure of stacking chips, comprising:
    forming a plurality of cavities on a first surface of a glass substrate according to a predetermined layout, wherein the cavities are recessed inside the first surface of the glass substrate;
    forming a plurality of through holes on the glass substrate and plating a metal on an inner surface of each of the through holes, wherein the through holes pass through the glass substrate;
    disposing a plurality of multiple signal processing chips respectively in the cavities and each of the signal processing chips is electrically connected with the inner surface of each of the through holes;
    forming a plurality of optical chips on a wafer; and
    stacking the wafer and the glass substrate so that the optical chips and the signal processing chips are electrically connected via the respective through holes.

2. The method of manufacturing a structure of stacking chips as claimed in claim 1, wherein the step of stacking the wafer and the glass substrate comprises:
    bonding the wafer on the first surface of the glass substrate.

3. The method of manufacturing a structure of stacking chips as claimed in claim 2, wherein the step of stacking the wafer and the glass substrate further comprises:
    applying an adhesive layer between the glass substrate and the wafer.

4. The method of manufacturing a structure of stacking chips as claimed in claim 1, wherein after the step of disposing multiple signal processing chips the method further comprises the step of:
    forming a conductive wire layer on a second surface opposite to the first surface to be selectively electrically connected with the through holes.

5. The method of manufacturing a structure of stacking chips as claimed in claim 1, further comprising the following steps after the step of stacking the wafer and the glass substrate:
    polishing the wafer;
    implanting multiple solder balls on the conductive wire layer; and
    slicing the wafer and the glass substrate stacked together.

* * * * *